United States Patent
Teh et al.

(10) Patent No.: US 8,407,541 B1
(45) Date of Patent: Mar. 26, 2013

(54) DYNAMIC TEST SIGNAL ROUTING CONTROLLER

(75) Inventors: Seong Hong Teh, Bayan Lepas (MY);
Seng Kuan Yeow, Pokok Sena (MY);
Shen Shen Lee, Port Dickson (MY)

(73) Assignee: Altera Corporation, San Jose, CA (US)

( * ) Notice: Subject to any disclaimer, the term of this patent is extended or adjusted under 35 U.S.C. 154(b) by 301 days.

(21) Appl. No.: 12/818,985

(22) Filed: Jun. 18, 2010

(51) Int. Cl.
*G01R 31/3177* (2006.01)
*G01R 31/327* (2006.01)

(52) U.S. Cl. ........................................ 714/726; 714/733

(58) Field of Classification Search .................. None
See application file for complete search history.

(56) References Cited

U.S. PATENT DOCUMENTS

| | | | |
|---|---|---|---|
| 4,947,357 A | 8/1990 | Stewart et al. | |
| 5,621,739 A * | 4/1997 | Sine et al. | 714/724 |
| 5,757,819 A | 5/1998 | Segars | |
| 5,831,993 A | 11/1998 | Graef | |
| 6,202,183 B1 * | 3/2001 | Ginetti et al. | 714/726 |
| 6,591,388 B1 * | 7/2003 | Vonreyn | 714/726 |
| 7,218,134 B1 | 5/2007 | Ho | |
| 7,301,836 B1 | 11/2007 | Raghavan et al. | |
| 7,343,536 B2 | 3/2008 | Han | |
| 2007/0035321 A1 * | 2/2007 | Gorodetsky et al. | 324/761 |

OTHER PUBLICATIONS

Ghosh Dastidar, Jayabrata, et al. U.S. Appl. No. 12/463,358, filed May 8, 2009.
Ghosh Dastidar, Jayabrata, et al. U.S. Appl. No. 12/568,136, filed Sep. 28, 2009.

\* cited by examiner

*Primary Examiner* — Ajay Bhatia
*Assistant Examiner* — Dipakkumar Gandhi
(74) *Attorney, Agent, or Firm* — Treyz Law Group; Jason Tsai (57) ABSTRACT

Integrated circuits with dynamic pin routing capabilities are provided. An integrated circuit may include circuitry under test and a dynamic signal routing controller. The dynamic signal routing controller may include multiplexers, a test register, and a signal select register. The circuitry under test may be connected to internal test lines that receive static test signals and dynamic test signals. The internal test lines that receive static test signals may be selectively routed to the test register (e.g., test registers store static test signals) while the internal test lines that receive dynamic test signals may be selectively routed to test pins (e.g., dynamic test signals are driven through the test pins). Each multiplexer may have a given input that is connected to the test register and additional inputs that are connected to the test pins. The signal select register stores control bits that configure the routing performed by each multiplexer.

20 Claims, 6 Drawing Sheets

DYNAMIC TEST SIGNAL ROUTING CONTROLLER

BACKGROUND

This relates generally to testing integrated circuits, and more particularly, to testing integrated circuits that are packaged with test-pin-limited packages.

Integrated circuits often include test pins through which test signals are conveyed to and from the integrated circuits during device testing. The test pins are used as input-output pins during normal operation (e.g., a user mode) to convey data signals. In one conventional test arrangement, integrated circuits include test pin sharing distribution blocks (TSDB) that are used for test pin reduction purposes. The test modes used in this test arrangement include an automatic test pattern generation (ATPG) mode, a memory mode, and a phase-locked loop input-output (PLL I/O) mode.

Each test pin is used as a global test pin or a shareable test pin. A global test pin is routed to an associated circuit under test (CUT) in each test mode. A shareable test pin can be routed to as many as three associated circuits under test in each test mode (i.e., the shareable test pin is shared among the three associated CUTs). The test pin sharing distribution blocks are responsible for routing the test pins to the associated CUTs during device testing.

Scan chains such as scan chains that are compliant with the well-known Joint Test Action Group (JTAG) standard are used to load test data into associated CUTs. Scan chains (scan chain registers) are also used to capture and unload corresponding test results from CUTs. Scan chains may be accessed using one or more test pins.

The association between each test pin and the corresponding circuit(s) under test provided by the test pin sharing distribution blocks is fixed. A given test pin that is used as a shareable test pin may be associated with first, second, and third CUTs during testing (e.g., the given test pin may be connected to first, second, and third CUTs). The given test pin can be reconfigured as a global test pin that is only routed to the first CUT. In this situation, the given test pin cannot be routed to another CUT that is different from the first, second, and third CUTs in the device under test. This limited flexibility in test pin routing may make it difficult or impossible to test integrated circuits with limited test pin counts.

Another conventional test arrangement, which that is used for testing integrated circuits such as programmable integrated circuits, relies on a slow speed test mode (SSTM). Programmable integrated circuits are often organized into rows of logic array blocks (LABs). The SSTM approach involves using a single bi-directional test pin for each row of LABs. Each test pin is able to function as an input test pin during loading of test data into the device and is able to function as an output test pin during reading of test data out of the device (device verification). The SSTM approach may also have limited flexibility in test pin routing and may make it difficult to test devices with limited test pin counts.

It would therefore be desirable to be able to provide integrated circuits with improved flexibility in test pin routing.

SUMMARY

Integrated circuits may be provided with a dynamic signal routing controller that provides dynamic pin routing capabilities. The dynamic signal routing controller enables an integrated circuit to be packaged using packages with reduced pin counts.

Integrated circuits may be provided with test signals during test mode. Integrated circuits may include circuitry under test that receives the test signals during device testing. The circuitry under test may have a required number of internal test lines that receive the test signals. Depending on the type of package used to package an integrated circuit, a given package may not always provide enough test pins for testing (e.g., the number of test pins available on the given package may be less than the number of internal test lines).

The dynamic signal routing controller provides flexibility in pin routing so that proper testing of an integrated circuit can be performed across different packages. The test signals that may be provided to the circuitry under test include static test signals and dynamic test signals. Static test signals are test signals that experience minimal toggling during testing whereas dynamic test signals are test signals that experience frequent toggling during testing. Static test signals have direct current (DC) or near DC attributes. Dynamics signals may operate at or near clock speeds (e.g., 100 MHz or more).

Each internal test line may be routed so as to receive a static test signal or a dynamic test signal. Software-based test generation tools may be used to compute the frequency of signal toggling that occurs at each internal test line. Internal test lines that require infrequent signal toggling may be configured to receive static test signals while internal test lines that require frequent signal toggling may be configured to receive dynamic test signals.

The dynamic signal controller may include multiplexers that perform configurable signal routing functions. Each multiplexer may have an output that is connected to a respective internal test line. Each multiplexer may have a given input that receives a corresponding static test signal from a test register and may have additional inputs that receive dynamic test signals from test pins. The multiplexers may be controlled using a multiplexer signal select register. The signal select register may be loaded with control bits that determine which of each multiplexer's inputs is passed to its output. The signal select register and the test register may be loaded with desired values using a scan process.

The signal select register may be loaded with signal select control data that provides the desired signal routing as determined by the test generation tools. During testing, the internal test lines that require dynamic test signals may be selectively connected to the test pins while the internal test lines that require static test signals may be selective connected to the test register.

In an extreme scenario, even if an integrated circuit package provides no test pins, testing can still be performed by loading test signals into the test register and by selectively providing the internal test lines with the test signals stored in the test register.

Further features of the present invention, its nature and various advantages will be more apparent from the accompanying drawings and the following detailed description.

DETAILED DESCRIPTION

This relates to testing integrated circuits. In particular, this relates to circuitry that is incorporated into integrated circuits to facilitate testing and to systems and methods for performing testing operations.

The integrated circuits being tested may be, for example integrated circuits such as application specific integrated circuits, digital signal processors, microprocessors or microcontrollers, programmable logic devices, etc.

Integrated circuits may be tested before and after packaging. An unpackaged integrated circuit may include wire bonding pads, solder ball bonding pads, or other suitable conductive regions to which electrical connections may be made during packaging. An integrated circuit package may include package pins, traces, or other suitable contacts.

Figure 1:
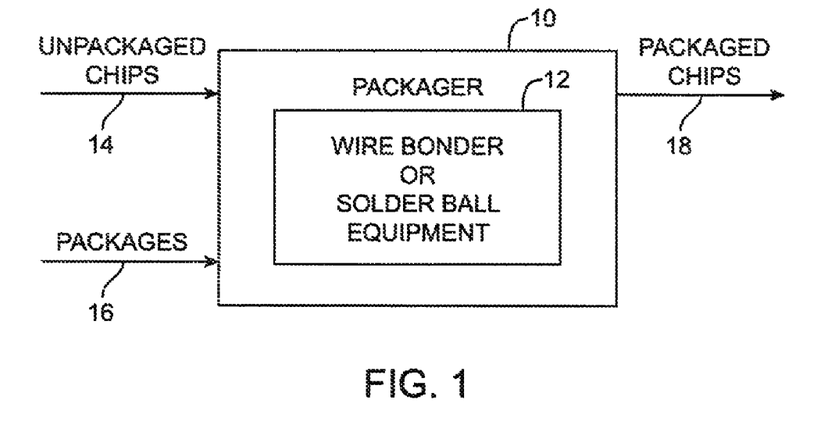
FIG. 1 is a diagram showing how an integrated circuit may be packaged in various types of packages using a packager in accordance with an embodiment of the present invention.

A packager that may be used to make appropriate connections between integrated circuit bonding pads and package pins during packaging is shown in FIG. 1. Packager 10 may include wire bonding equipment, solder-ball packaging equipment 12, or other suitable packaging equipment. As shown in FIG. 1, packager 10 may receive unpackaged integrated circuits 14 and packages 16. Any suitable type of packages 16 may be used to package circuits (chips) 14 (e.g., dual in-line packages, ball grid array packages, etc.).

The resulting packaged versions of the integrated circuits are provided as an output of packager 10 (shown as packaged chips 18 in FIG. 1). The electrical connections made during packaging between the integrated circuit wire bonding pads and package pins are hardwired connections (e.g., connections formed by wire bonds or solder balls). The package pins may receive input-output signals from external sources and may sometimes be referred to as input-output (I/O) pins or test pins.

Figure 2:
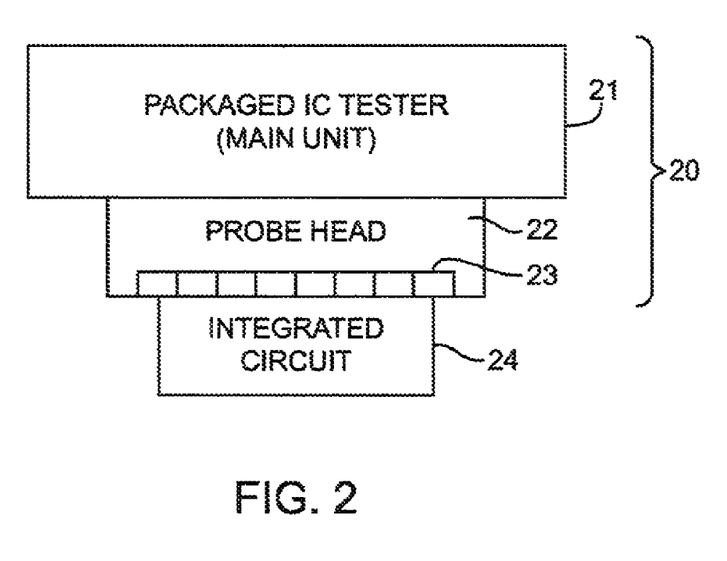
FIG. 2 is a diagram of an illustrative packaged integrated circuit tester in accordance with an embodiment of the present invention.

Packaged integrated circuits can be tested using tester 20 of FIG. 2. As shown in FIG. 2, packaged integrated circuit tester 20 includes a main unit 21. Main unit 21 includes computing equipment that may provide test configuration data and test vectors to a packaged integrated circuit under test 24. As integrated circuit 24 responds to the applied test vectors, the main unit 21 can be used to gather output data from circuit 24 and can analyze this data to determine whether integrated circuit 24 is performing properly. In programmable integrated circuits, different sets of test configuration data may be supplied to an integrated circuit under test.

Main unit 21 is electrically connected to probe head 22. Probe head 22 has probe tips or other suitable conductive structures 23 that mate with the pins of the package of integrated circuit 24. Positioning equipment may be used to position each integrated circuit 24 into electrical contact with tester 20 as shown in FIG. 2.

During test operations, packaged integrated circuit tester 20 may load test data (test signals) into integrated circuit 24 through the points of contact between the probe heads and the internal circuitry of circuit 24. These contact points are sometimes referred to as "probe points." Probe points are the pins on the package (regardless of shape), because the probe head 22 makes electrical contact with the pins of the package of the integrated circuit.

Figure 3:
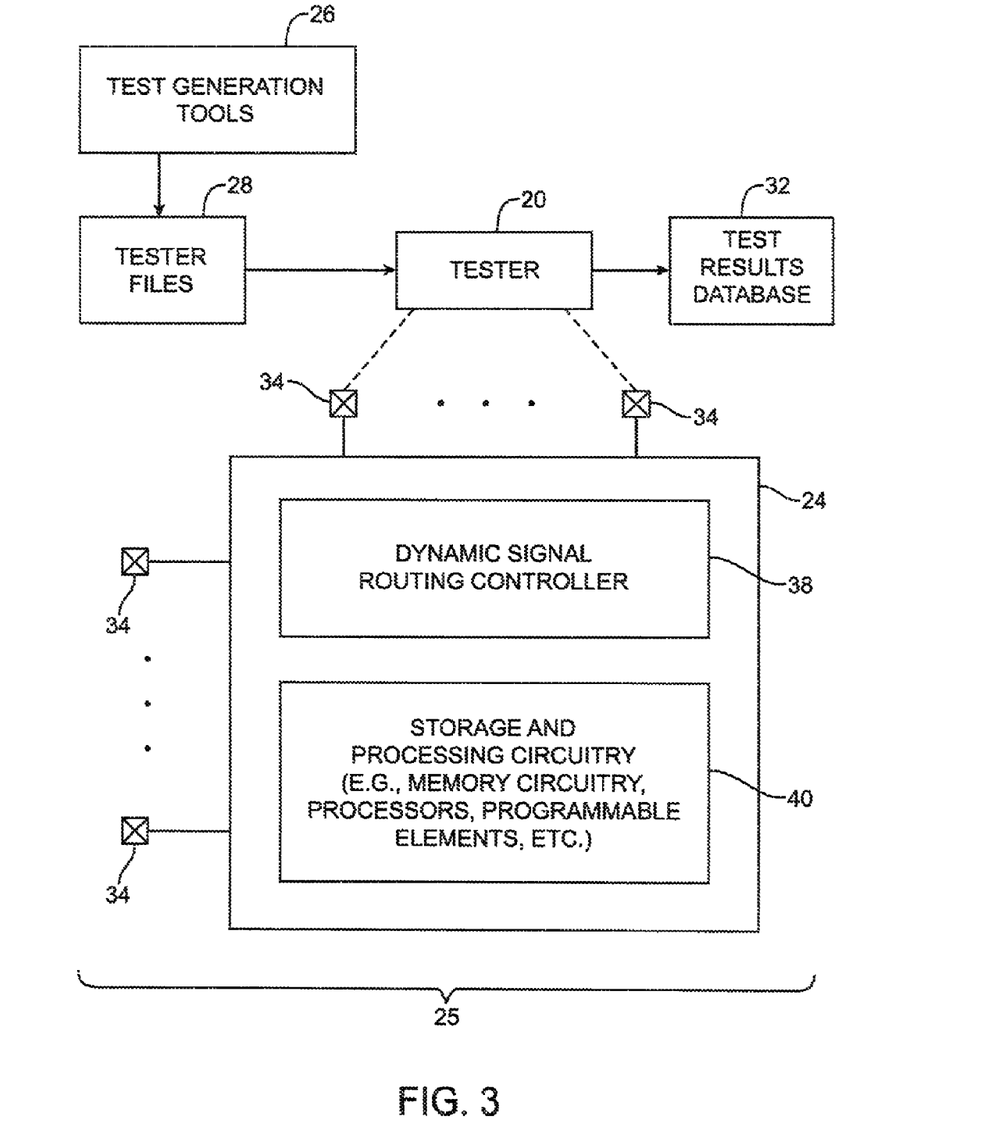
FIG. 3 is a diagram of an illustrative system in which integrated circuits may be tested in accordance with an embodiment of the present invention.

A system in which packaged integrated circuit 24 may be tested is shown in FIG. 3. As shown in FIG. 3, system 25 may include an integrated circuit 24 that is tested using a tester 20 of the type described in connection with FIG. 2. Because integrated circuit 24 is being tested by tester 20, integrated circuit 12 may sometimes be referred to as a device under test ("DUT").

Test generation tools 26 may be used to generate tester files 28 for use by tester 20. Tester 20 may be implemented using testing code that runs on a personal computer platform or on other suitable computing equipment (e.g., computing equipment 40 of FIG. 2). Tester 20 may use tester files 28 in determining how to configure integrated circuit 24 for testing and in determining which test vectors to apply to integrated circuit 24. Tester 20 may also use tester files 28 (or associated information) in evaluating whether the resulting output signals that are produced by circuit 24 during testing have expected values. If the signals that are produced by integrated circuit 24 do not match the expected values, tester 20 can conclude that integrated circuit 24 contains a fault. Test analysis operations on the measured test signals may be performed to produce reports and other test results. The test results may be stored in storage in system 25. For example, tester 20 may store test results in one or more databases such as test results database 32. Following satisfactory testing and debugging operations, integrated circuit 24 may be configured to operate in a user mode to provide desired functionality.

Test data and operational data may be loaded into integrated circuit 24 through pins 34 during test operations and normal operation, respectively. As shown in FIG. 3, pins 34 may represent package pins that are connected to the wire bonding pads of integrated circuit 24.

Pins 34 may sometimes be referred to as test pins, because test signals may be conveyed through pins 34 during device testing (test mode). During normal operation (user mode), pins 34 may be referred to as control pins and may be used to drive analog input-output ports, data buses, address buses, control circuitry, etc. Pins 34 may also be used for supplying power supply signals to integrated circuit 24.

Test generation tools 26 and tester 20 may be implemented using computing equipment such as one or more computers. These computers may be linked by a communications network (e.g., a local area network, wide area networks such as the internet, etc.). Databases may be used to store data such as tester files, test results, configuration data files, etc. Databases and other storage may be implemented using computers or using separate storage media or storage appliances.

Pins 34 (test pins) through which test signals are conveyed may be connected to a dynamic switching circuit such as dynamic signal routing controller 38. Integrated circuit 24 may include storage and processing circuitry 40 such as memory circuits, processors, programmable circuits, etc.

Dynamic signal routing controller 38 may be configured to dynamically connect test pins 34 to any number of circuits in storage and processing circuitry 40. Test signals on pins 34 may therefore be routed to circuitry in circuit 24 and signals from within circuit 24 may be routed to test pins 24. This ability to dynamically route signals between circuitry 40 and test pins allows integrated circuits 24 that are packaged using integrated circuit packages with different pin counts to be tested using tester 20.

Dynamic signal routing controller 38 provides a flexible way of routing test pin signals and greatly reduces the number of test pins required on the package. Dynamic signal routing controller 38 allows integrated circuit 24 to be packaged using packages with severely limited pin counts. In an extreme scenario, integrated circuit 24 can still be tested even if no test pins are available.

Figure 4:
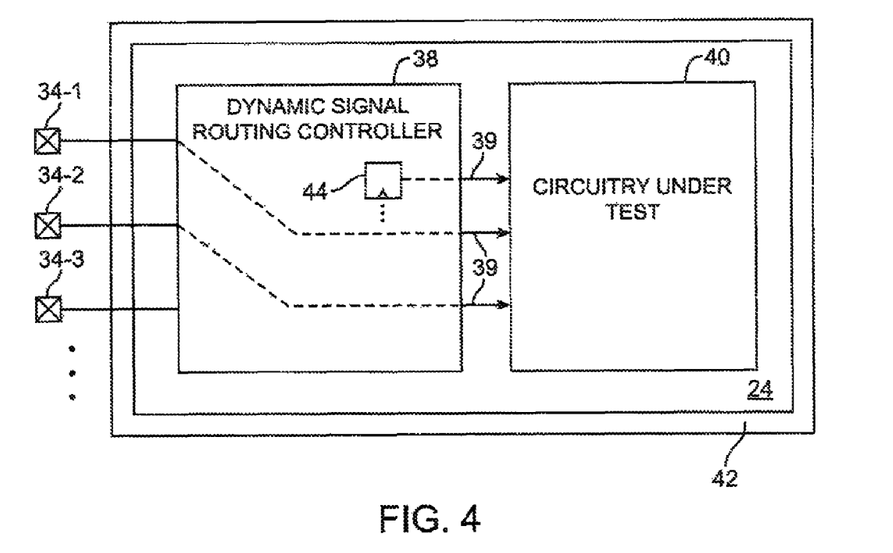
FIG. 4 is a diagram of an illustrative integrated circuit showing how test pins may be routed to circuitry under test using a dynamic signal routing controller in accordance with an embodiment of the present invention.
Figure 5:
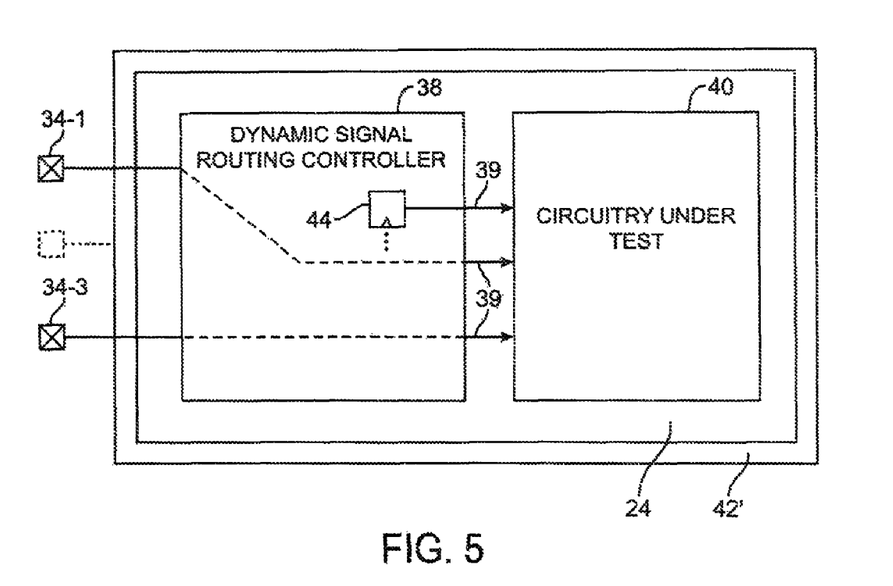
FIG. 5 is a diagram of the integrated circuit of FIG. 4 that has been packaged in a different package showing how the test pins may be re-routed to the circuitry under test using the dynamic signal routing controller in accordance with an embodiment of the present invention.

FIGS. 4 and 5 illustrate how controller 38 may be used to provide dynamic test pin signal routing functions. The storage and processing circuitry of circuit 24 (also referred to as circuitry under test 40) may receive test signals that are conveyed over internal test lines 39 from dynamic signal routing controller 38.

The test signals that are fed to circuitry 40 may be categorized as "dynamic" test signals (e.g., test signals that toggle frequently during testing) or as "static" test signals (e.g., test signals that toggle infrequently during testing). For example, static test signals may only change values once or twice during a test run. Static test signals can have values that are either logic "1" or logic "0" (i.e., static test signals are digital signals).

Dynamic test signals may toggle more than twice during testing (e.g. hundreds or thousands of times) and may have values that range from logic "0" to logic "1," inclusive (i.e., dynamic test signals can be digital or analog signals).

Dynamic signal routing controller 38 may provide static and dynamic signals to circuitry 40 by routing the static and dynamic signals to internal test lines 39 (sometimes collectively referred to as a test port). Controller 38 may include storage elements such as one or more flip-flop 44 that provide the static signals to the test port (as an example). Controller 38 may also include switching circuitry that selectively connects the test pins through which dynamic test signals are conveyed to desired internal test lines 39.

Consider a first scenario in which integrated circuit 24 is packaged using a first package 42, as shown in FIG. 4. The first package may include test pins such as pins 34-1, 34-2, and 34-3. Circuitry 40 may have first, second, and third input terminals. The first input terminal may be a static signal input terminal, because the first input terminal is associated with circuits that do not require test signals that toggle frequently (as an example). The second and third input terminals may, for example, be dynamic signal input terminals, because the second and third input terminals are associated with circuits that require test signals that toggle frequently.

The first input terminal may therefore be connected (routed) to flip-flop 44 to receive a static test signal while the second and third input terminals may be respectively routed to test pins 34-1 and 34-2 to receive dynamic test signals (see, e.g., FIG. 4). In general, static signal input terminals of circuitry 40 should be selectively connected to flip-flops 44 while dynamic signal input terminals should be selectively connected to the test pins.

Consider a second scenario in which integrated circuit 24 is packaged using a second package 42', as shown in FIG. 5. The second package may have fewer test pins than the first package (e.g., the second package may not have pin 34-2). In this scenario, the first input terminal of circuitry 40 may be connected to flip-flop 44 to receive a static test signal while the second and third input terminals may be respectively connected to test pins 34-1 and 34-3 by controller 38 to receive dynamic test signals (see, e.g., FIG. 5).

Note that the third input terminal in the example of FIG. 5 is dynamically connected to test pin 34-3 by dynamic signal routing controller 38. The ability of integrated circuit 24 to be dynamically configured in this way provides flexibility and allows various different patterns of test pins 34 to be used in the integrated circuit package.

The test pins and internal test lines 39 shown in FIGS. 4 and 5 are merely illustrative. If desired, the test pins and internal test lines may be bi-directional to load test signals into circuitry 40 and to unload (read) test signals from circuitry 40.

Figure 6:
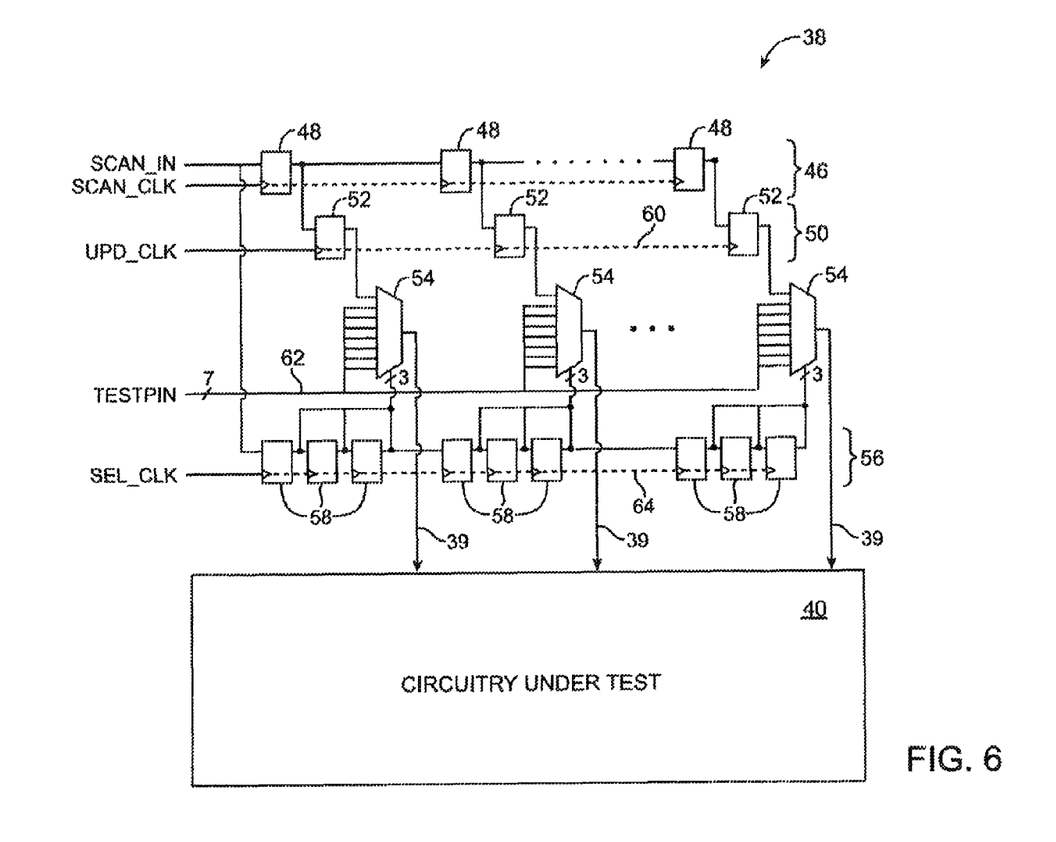
FIG. 6 is a circuit diagram of an illustrative dynamic signal routing controller in accordance with an embodiment of the present invention.

An illustrative circuit implementation of dynamic signal routing controller 38 is shown in FIG. 6. As shown in FIG. 6, internal test lines 39 may be connected between circuitry 40 and the outputs of multiplexers 54. Each multiplexer 54 may be controlled so that is passes to its output a static test signal from a selected one of its inputs or a dynamic test signal received from one of the test pins (e.g., multiplexers 54 may be controlled to dynamically route the test signals to the internal test lines that form a test port for circuitry 40).

Each multiplexer 54 may have an input that is connected to an output of an associated flip-flop 52. Each flip-flop 52 may be associated with a corresponding multiplexer 54 and may provide a static test signal for that multiplexer at its output. Flip-flops 52 may collectively be referred to as test register 50. Test register 50 may be controlled (clocked) by update clock signal UPD_CLK, which is provided over line 60 (as an example).

Clock signal UPD_CLK may be enabled to load the contents of scan chain 46 into test register 50 in parallel. Scan chain 46 (sometimes referred to as a scan chain register) includes flip-flops 48 connected in a chain. The output of each scan chain flip-flop 48 (data output of scan chain 46) may be connected to the input of an associated test register flip-flop 52 in register 50 (data input of test register 50), as shown in FIG. 6. The data outputs of scan chain 46 may be connected to corresponding data inputs in test register 50.

Scan chain 46 may be used to scan in static test signals from tester 20. Scan chain 46 may receive a scan input data signal SCAN_IN from a scan-in test pin and may receive a scan clock signal SCAN_CLK from a scan-clock test pin. For example, static test signals may be presented at the scan-in test pin while clocking signal SCAN_CLK to shift in the static test signals into scan chain 46. Once a set of static test signal values has been shifted into scan chain 46, the set of static test signal values that has been loaded may be loaded (latched) in parallel into test register 50 by enabling signal UPD_CLK.

Any number of multiplexers 54 may be used in dynamic test signal routing controller 38 to provide static and dynamic signals to a corresponding number of internal test lines 39. The length of test register 50 (i.e., the number of flip-flops 52 in test register 50) may be equal to the number of multiplexers 54. Similarly, the length of scan chain 46 (i.e., the number of flip-flops 48 connected in series) is equal to the length of test register 50.

If an integrated circuit package has no test pins (i.e., no pins connected to the TESTPIN lines of FIG. 6), testing can still be performed by loading in test signals into test register 50 and by selectively passing the contents of test register 50 to the outputs of multiplexers (e.g., by configuring each multiplexer 54 to connect flip-flop 52 to a corresponding internal test line 39).

Static test signals provided by test register 50 are toggled infrequently during testing. Static test signals that are routed to internal test lines 39 may, for example, change values once or twice during testing. Changing the values of the static test signals may require shifting in a new set of test signal values into scan chain register 46 and then latching the new set of test signals with test register 50 by asserting UPD_CLK.

Toggling the values of the static test signals in this way can be slow, because a new set of data needs to be shifted into scan chain 46 prior to each toggle. Nevertheless, test time will not be increased significantly if the static test signals toggle relatively infrequently during testing. It is therefore generally not desirable to provide test signals that change values frequently (e.g., test signals that toggle more than twice during testing) using test register 50 whenever testing speed is a concern.

Internal test lines 39 that require test signals that change values frequently may be obtained from the test pins. The test pins are connected to external signal sources (e.g., test 20). The external sources can be used to provide desired digital or analog dynamic test signals through the test pins.

Each multiplexer 54 of controller 38 may have additional inputs other than the inputs that are connected to the test pins. For example, each multiplexer 54 may be an eight-to-one multiplexer. In this situation, each multiplexer 54 may have one of its inputs connected to a flip-flop 52 in test register 50 and may have its other inputs connected to seven different test pins over path 62, as shown in FIG. 6. Each multiplexer 54 may then be adjusted so as to route one of its inputs to its output (i.e., multiplexer 54 can be selectively configured to route one of its inputs to corresponding internal test line 39).

In the example of FIG. 6, each eight-to-one multiplexer 54 may be controlled by three control bits stored in three associated flip-flops 58 or other suitable memory elements. Flip-flops 58 may be connected in a chain to form multiplexer signal select register 56.

Signal select register 56 may be used to control multiplexers 54 so that multiplexers 54 provide a desired pattern for routing the static and dynamic test signals to the internal test lines. For example, a group of associated flip-flops 58 may be loaded with "000" to configure a given multiplexer to pass a static test signal stored in flip-flop 52 to internal test line 39. In another scenario, the group of three associated flip-flops 58 may be loaded with "011" control bits to configure the given multiplexer to pass a dynamic test signal driven through the third test pin to corresponding internal test line 39.

Multiplexer signal select register 56 is a shift register and may have an input that is connected to the scan-in test pin and a control input that receives a select clock signal SEL_CLK from a select-clock test pin. For example, select signals (multiplexer control data) may be presented at the scan-in test pin while clocking signal SEL_CLK to shift in select signal values into signal select register 56. Once a set of select signal values is shifted into signal select register 56, the set of select signal values may be used to control multiplexers 54 to perform desired test signal routing.

The set of select signal values that is used to configure circuitry 38 to implement a desired test signal routing pattern may be determined by a software-based test generation tool during test development (before actual device testing). The test generation tool (e.g., tool 26 of FIG. 3) can calculate the frequency of signal toggling that is seen at each internal test line. For example, if a first internal test line requires minimal signal toggling, the first internal test line will be selectively connected to test register 50 to receive a static test signal. If a second internal test line requires frequent signal toggling, the second internal test line will be selectively connected to a test pin to receive a dynamic test signal.

The circuit implementation of dynamic signal routing controller 38 as shown in FIG. 6 is merely illustrative. Multiplexers 54 may, for example, be two-to-one, four-to-one, 16-to-1, or 32-to-1 multiplexers that are each controlled by one bit, two bits, four bits, or five bits of signal select multiplexer control data, respectively. Each multiplexer 54 may receive a static test signal from an associated flip-flop 52 and may receive one or more dynamic test signals from respective test pins. Multiplexers 54 may then be used to supply test signals to the internal test lines.

Figure 7:
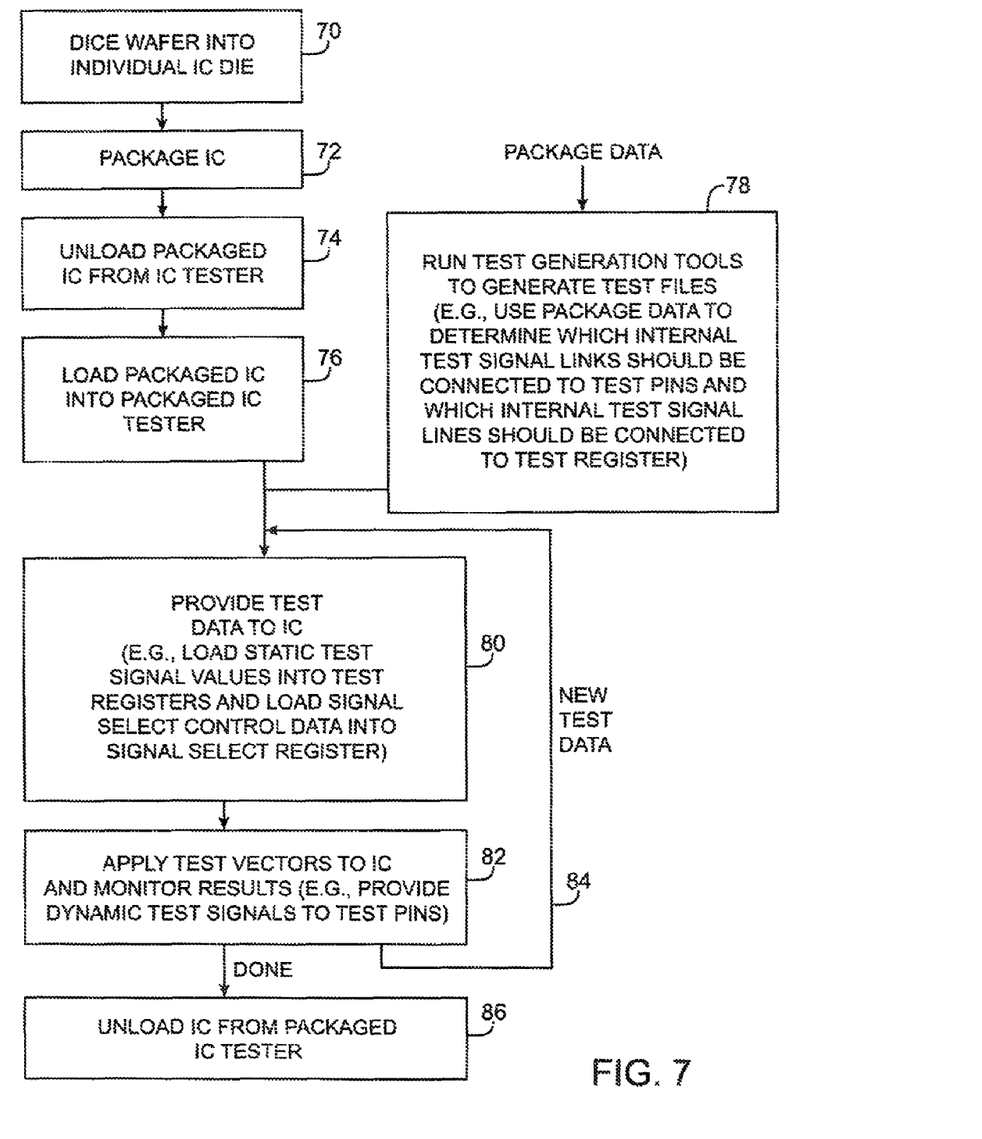
FIG. 7 is a flow chart of illustrative steps involved in configuring a dynamic signal routing controller for device testing in accordance with an embodiment of the present invention.

Illustrative steps involved in testing packaged integrated circuits 24 are shown in FIG. 7.

At step 70, a wafer containing integrated circuits 24 is separated into individual unpackaged integrated circuits. The circuits 24 may be separated by sawing the wafer, by cleaving the wafer, etc.

At step 72, the integrated circuits 24 are packaged into individual packages using packager 10 (FIG. 1). During packaging, the pins of the packages are connected to respective circuitry in integrated circuits 24. Different packages may have different pin configurations (e.g., different numbers of pins). After the integrated circuits 24 have been packaged, the packaged integrated circuits 24 are unloaded from packager 10 (step 74).

At step 76, a packaged integrated circuit 24 is loaded into packaged integrated circuit tester 20 (FIG. 2). When loaded into tester 20, the probe points on integrated circuit 24 make electrical contact with mating portions of probe head 22. The tester 20 applies power to integrated circuit 24 (e.g., by applying sources of positive voltage and ground potential to the integrated circuit through head 22 or other electrical paths). Tester 20 uses main unit 21 and probe head 22 to apply the desired control (test) signals to circuit 24 in real time.

At step 78, test generation tools 26 may receive data and may generate corresponding test files. The test generation tool may, for example, calculate the frequency of signal toggling that is expected to occur at each internal test line during testing. The test generation tools can then determine which internal test lines should be connected to test pins (e.g., which internal test lines experience frequent signal toggling and should therefore be routed to test pins to receive dynamic test signals) and which internal test lines should be connected to the test register (e.g., which internal test lines will experience minimal signal toggling and should therefore be routed to the test register to receive static test signals). Step 78 may be performed prior to actual device testing.

At step 80, main unit 21 of tester 20 uses probe head 23 to provide test data to integrated circuit 24 (e.g., tester 20 can load static test signal values through scan chain 46 into test register 50 and can load signal select control data into signal select register 56). At this point, multiplexers 54 of FIG. 6 are configured to implement a desired signal routing pattern, because the signal select register has been loaded. If desired, programmable logic on circuit 24 can be configured by loading test configuration data into programmable memory elements (e.g., configuration random-access memory).

At step 82, the tester 20 applies a series of test vectors to the integrated circuit 34 and monitors the corresponding results (e.g., tester 20 applies the dynamic test signals to the test pins). This allows the tester to analyze the performance of the integrated circuit.

As shown by line 84, the tester may obtain new test data (test signals) and the process of steps 80 and 82 may be repeated (e.g., hundreds or thousands of times). Steps 80 and 82 may be repeated until all sets of desired test data have been applied and the results associated with each different set of test data and associated test vectors have been gathered and analyzed.

At step 86, when testing is complete, the packaged integrated circuit may be unloaded from the packaged integrated circuit tester. If the integrated circuit performed properly during testing, it may be sold to a customer. If an error was detected, the integrated circuit may be repaired or other suitable actions may be taken.

The foregoing is merely illustrative of the principles of this invention and various modifications can be made by those skilled in the art without departing from the scope and spirit of the invention.

What is claimed is:

1. An integrated circuit having circuitry under test with a test port, wherein the test port includes a plurality of internal test lines, comprising:
   a plurality of input-output pins;
   a test register having outputs; and
   a plurality of multiplexers each of which has a given input that is connected to a respective output of the test register, each of which has other inputs that are connected to the plurality of input-output pins, and each of which has an output connected to a respective one of the internal test lines.

2. The integrated circuit defined in claim 1, further comprising a scan chain register connected to the test register.

3. The integrated circuit defined in claim 2, further comprising a signal select register connected to the plurality of multiplexers.

4. The integrated circuit defined in claim 1, further comprising a scan chain register having data outputs connected in parallel to data inputs in the test register.

5. The integrated circuit defined in claim 4, further comprising a signal select register that supplies control signals to the plurality of multiplexers to configure each of the plurality of multiplexers to selectively connect one of its inputs to its output.

6. The integrated circuit defined in claim 1, further comprising a signal select register connected to the plurality of multiplexers, wherein the signal select register is loaded with multiplexer control data.

7. The integrated circuit defined in claim 1, further comprising a signal select register that configures each of the plurality of multiplexers to selectively connect one of its inputs to its output, wherein at least some of the input-output pins supply test signals.

8. An integrated circuit, comprising:
   a plurality of input-output pins that receive dynamic test signals;
   a test register;
   a plurality of multiplexers each of which has a given input that receives a respective static test signal from the test register, each of which has other inputs that receive the dynamic test signals from the input-output pins, and each of which has an output;
   a plurality of internal test lines; and
   circuitry under test, wherein the circuitry under test is connected to the plurality of internal test lines, wherein each internal test line is connected to the output of a respective one of the plurality of multiplexers, and wherein each multiplexer is configured to selectively connect one of its inputs to its output.

9. The integrated circuit defined in claim 8, further comprising a scan chain register connected to the test register, wherein the scan chain register provides the test register with the static test signals.

10. The integrated circuit defined in claim 9, further comprising a signal select register connected to the plurality of multiplexers.

11. The integrated circuit defined in claim 8, further comprising a scan chain register connected in parallel with the test register, wherein the scan chain register loads the static test signals in parallel into the test register.

12. The integrated circuit defined in claim 11, further comprising a signal select register that configures each of the plurality of multiplexers to selectively connect one of its inputs to its output.

13. The integrated circuit defined in claim 8, further comprising a multiplexer signal select register connected to the plurality of multiplexers.

14. The integrated circuit defined in claim 8, further comprising a signal select register that is loaded with control data bits and that configures each of the plurality of multiplexers to selectively connect one of its inputs to its output, wherein the integrated circuit comprises a packaged integrated circuit.

15. A method of routing test signals on an integrated circuit having input-output pins, circuitry under test, and a dynamic test signal routing controller, wherein the dynamic test signal routing controller includes a test register, a signal select register, and a plurality of multiplexers each of which has inputs and each of which has an output and wherein the circuitry under test is connected to the outputs of the plurality of multiplexers, the method comprising:
   with external equipment, providing dynamic test signals through the input-output pins to at least one of the inputs in each of the plurality of multiplexers;
   with the test register, providing a respective static test signal to at least one of the inputs in each of the plurality of multiplexers; and
   with the signal select register, configuring each of the plurality of multiplexers to selectively connect one of its inputs to its output.

16. The method defined in claim 15, further comprising:
   with a scan chain register, loading the static test signals into the test register.

17. The method defined in claim 16, wherein the integrated circuit further includes at least one scan chain test pin, the method further comprising:
   with the external equipment, loading multiplexer control bits into the signal select register through the scan chain test pin.

18. The method defined in claim 17, wherein each multiplexer has a control input and wherein configuring each of the plurality of multiplexers comprises providing at least some of the multiplexer control bits to the control input of each multiplexer.

19. The method defined in claim 15, wherein the integrated circuit further includes at least one scan chain test pin, the method further comprising:
   with the external equipment, loading multiplexer control bits into the signal select register through the scan chain test pin.

20. The method defined in claim 15, wherein each multiplexer has a control input and wherein configuring each of the plurality of multiplexers comprises providing multiplexer control bits to the control input of each multiplexer.

* * * * *